(12) United States Patent
Pelzer et al.

(10) Patent No.: US 7,952,259 B2
(45) Date of Patent: May 31, 2011

(54) ELECTRONIC APPARATUS WITH A MICRO-ELECTROMECHANICAL SWITCH MADE OF A PIEZOELETRIC MATERIAL

(75) Inventors: Heiko Pelzer, Erkelenz (DE); Peter Gerard Steeneken, Eindhoven (NL); Astrid Lewalter, Aachen (DE)

(73) Assignee: NXP B.V., Eindhoven (NL)

( * ) Notice: Subject to any disclaimer, the term of this patent is extended or adjusted under 35 U.S.C. 154(b) by 706 days.

(21) Appl. No.: 10/584,044

(22) PCT Filed: Dec. 21, 2004

(86) PCT No.: PCT/IB2004/052881
§ 371 (c)(1),
(2), (4) Date: Nov. 21, 2008

(87) PCT Pub. No.: WO2005/064634
PCT Pub. Date: Jul. 14, 2005

(65) Prior Publication Data
US 2009/0211884 A1 Aug. 27, 2009

(30) Foreign Application Priority Data

Dec. 22, 2003 (EP) .................................. 03104894

(51) Int. Cl.
*H01L 41/08* (2006.01)
(52) U.S. Cl. ..................... 310/331; 310/328; 200/181
(58) Field of Classification Search ................. 310/328, 310/330–332
See application file for complete search history.

(56) References Cited

U.S. PATENT DOCUMENTS

| | | | |
|---|---|---|---|
| 5,202,703 A | 4/1993 | Hoisington et al. | |
| 6,483,056 B2 * | 11/2002 | Hyman et al. | 200/181 |
| 6,504,118 B2 * | 1/2003 | Hyman et al. | 200/181 |
| 7,098,577 B2 * | 8/2006 | Mehta | 310/332 |
| 7,215,064 B2 * | 5/2007 | Mehta | 310/331 |
| 7,215,066 B2 * | 5/2007 | Kawakubo et al. | 310/348 |
| 7,345,404 B2 * | 3/2008 | Klee et al. | 310/330 |
| 7,372,191 B2 * | 5/2008 | Ohmori et al. | 310/330 |
| 7,420,320 B2 * | 9/2008 | Sano et al. | 310/363 |
| 7,427,797 B2 * | 9/2008 | Ohguro et al. | 257/415 |
| 7,459,827 B2 * | 12/2008 | Kawakubo et al. | 310/309 |
| 7,471,031 B2 * | 12/2008 | Kawakubo et al. | 310/330 |
| 7,471,176 B2 * | 12/2008 | Bunyan et al. | 335/78 |
| 7,567,018 B2 * | 7/2009 | Kawakubo et al. | 310/328 |
| 7,592,739 B2 * | 9/2009 | Robert | 310/330 |
| 7,633,213 B2 * | 12/2009 | Takayama et al. | 310/331 |
| 7,656,071 B2 * | 2/2010 | Mehta | 310/324 |
| 2001/0005213 A1 | 6/2001 | Ikeda et al. | |
| 2006/0119227 A1 * | 6/2006 | Ikehashi | 310/348 |
| 2007/0024403 A1 * | 2/2007 | Kwon et al. | 335/78 |
| 2007/0209176 A1 * | 9/2007 | Kawakubo et al. | 29/25.35 |

FOREIGN PATENT DOCUMENTS

| | | |
|---|---|---|
| EP | 0 656 665 | 6/1995 |
| EP | 0 767 503 | 4/1997 |
| WO | WO 01/13457 | 2/2001 |
| WO | WO 2004/038819 | 5/2004 |
| WO | WO 2004/040611 | 5/2004 |
| WO | WO 2004/063090 | 7/2004 |

* cited by examiner

*Primary Examiner* — J. SanMartin

(57) ABSTRACT

The device improved according to the invention comprises a micro-electromechanical switch (MEMS) with a piezoelectric element connected to a mechanical support on both sides at the edges. The electrode design of this piezoelectric element is characterized by two electrodes mounted on at least one of the surfaces.

13 Claims, 9 Drawing Sheets

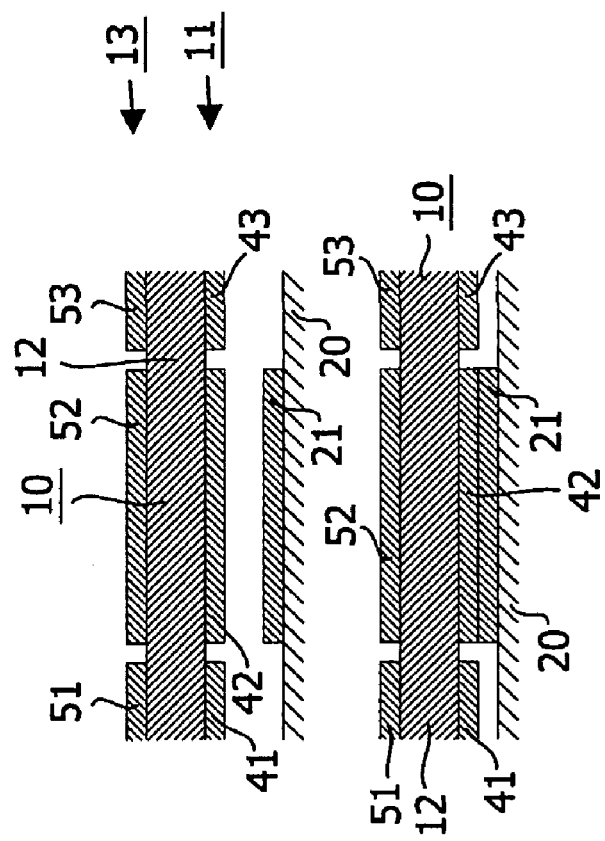
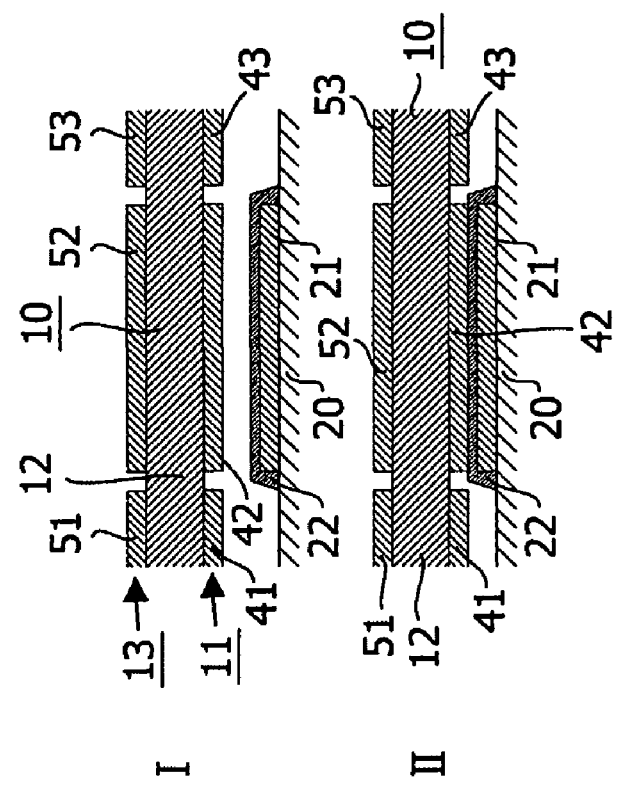

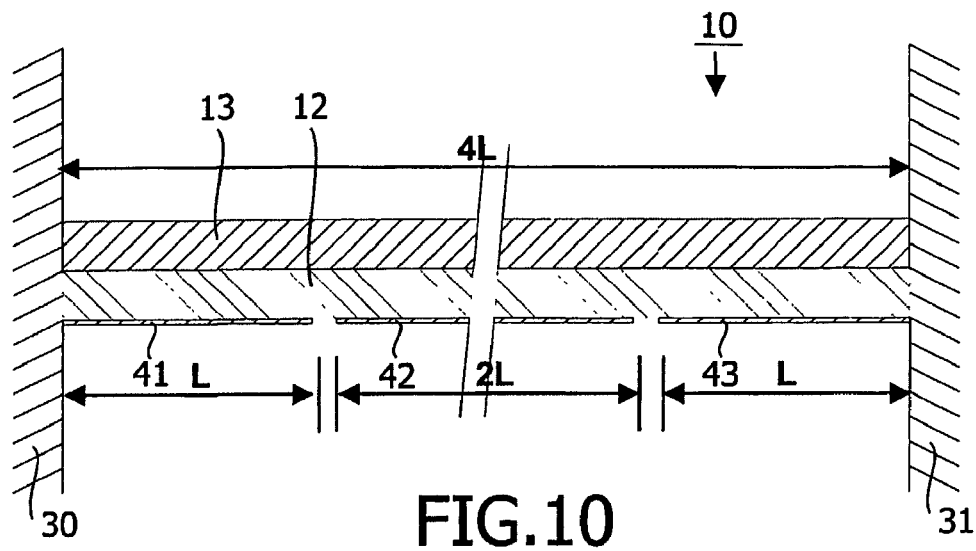
FIG.10
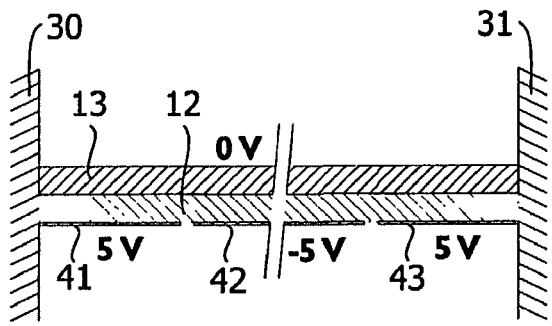
FIG.11A
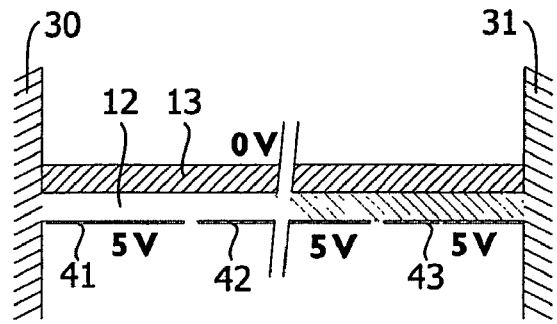
FIG.11B
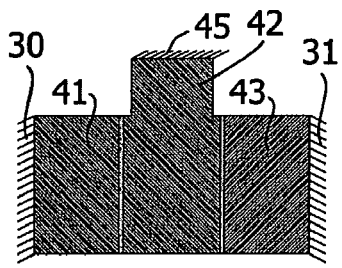
FIG.12A
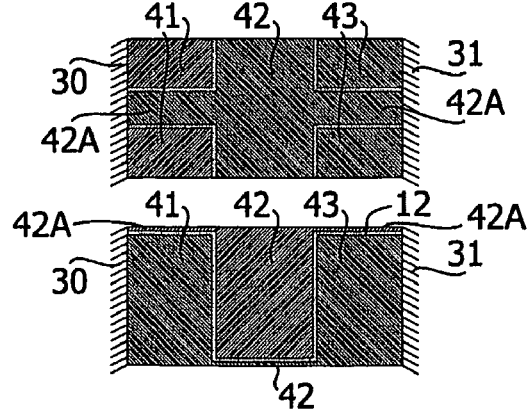
FIG.12B
FIG.12C

ELECTRONIC APPARATUS WITH A MICRO-ELECTROMECHANICAL SWITCH MADE OF A PIEZOELETRIC MATERIAL

The invention relates to an electronic device with a micro-electromechanical switch, comprising:
- a piezoelectric element with a piezoelectric layer located between a first and a second electrode layer,
- a first and a second MEMS electrode, said first MEMS electrode being located on a surface of the piezoelectric element and said second MEMS electrode being located on the surface of a substrate, so that the first MEMS electrode moves away from and/or towards the second MEMS electrode under the application of an actuating voltage to the piezoelectric element.

Such a device is known from literature. Micro-electromechanical switches (MEMS) are an interesting alternative to semiconductor switches. The possibility of avoiding the intrinsic capacitance of semiconductor switches while gaining lower volume resistivity values, in particular, has made MEMS the focus of intensive research and development activities in recent years. Through the first products are already in use, they have so far been restricted to applications capable of providing the relatively high switching voltages involved. Solutions operating at voltages below 5 V are pursued with particular interest, because they would open up the whole area of mobile telecommunications to MEMS. For this reason, increasing research effort has been devoted to piezo-MEMS, because they require significantly lower switching voltages than purely electrostatically switched MEMS.

Figure 1:
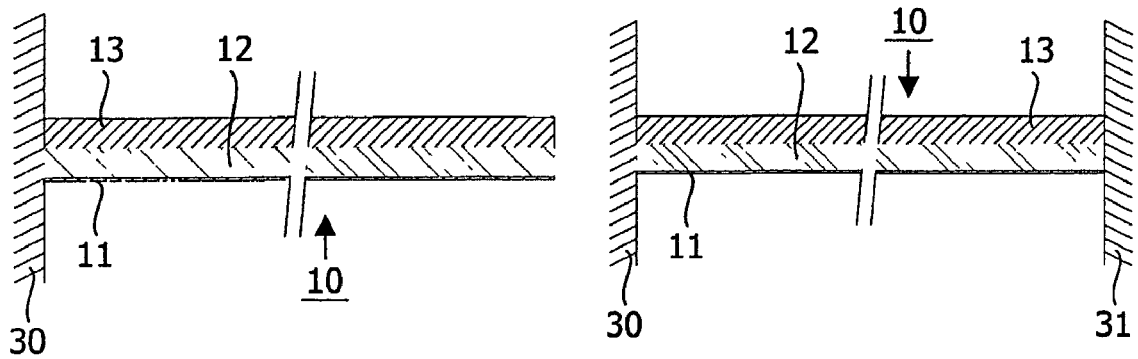

FIG. 1 is a basic diagram of piezoceramic plates cantilevered and clamped at both ends respectively; these represent the core of any piezo-MEMS. The basic principle is the same in both cases. The upper and lower surfaces of the piezoceramic plate 12 support electrode layers 11, 13 causing the piezoceramic plate to contract or expand when a voltage is applied. Together with the electrode layers 11, 13, the piezoceramic plate 12 forms the piezoelectric element. This is connected to a substrate via one or more supports to which the element 10 is clamped on one side 30 or on both sides 30, 31. The illustrated configuration is based on the d31 piezoelectric coefficient, i.e. the piezoceramic plate 12 is polarized along the face normal of the electrodes in the +z direction. The bending of the piezoceramic plate is caused by a gradient in rigidity. The electrodes 11, 13 on the upper and lower surfaces may accordingly be made of the same metals, but the layer thickness values have to be different. Another possible solution is the use of different electrode materials with different rigidity values. A combination of the two principles is feasible as well.

Figure 2:
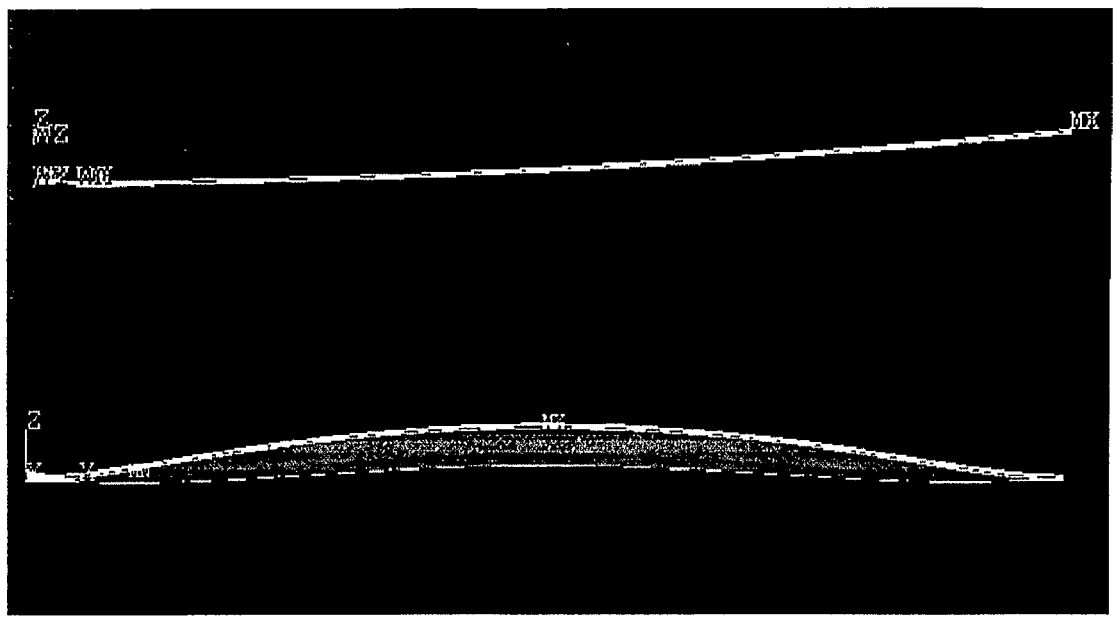
Figure 3:
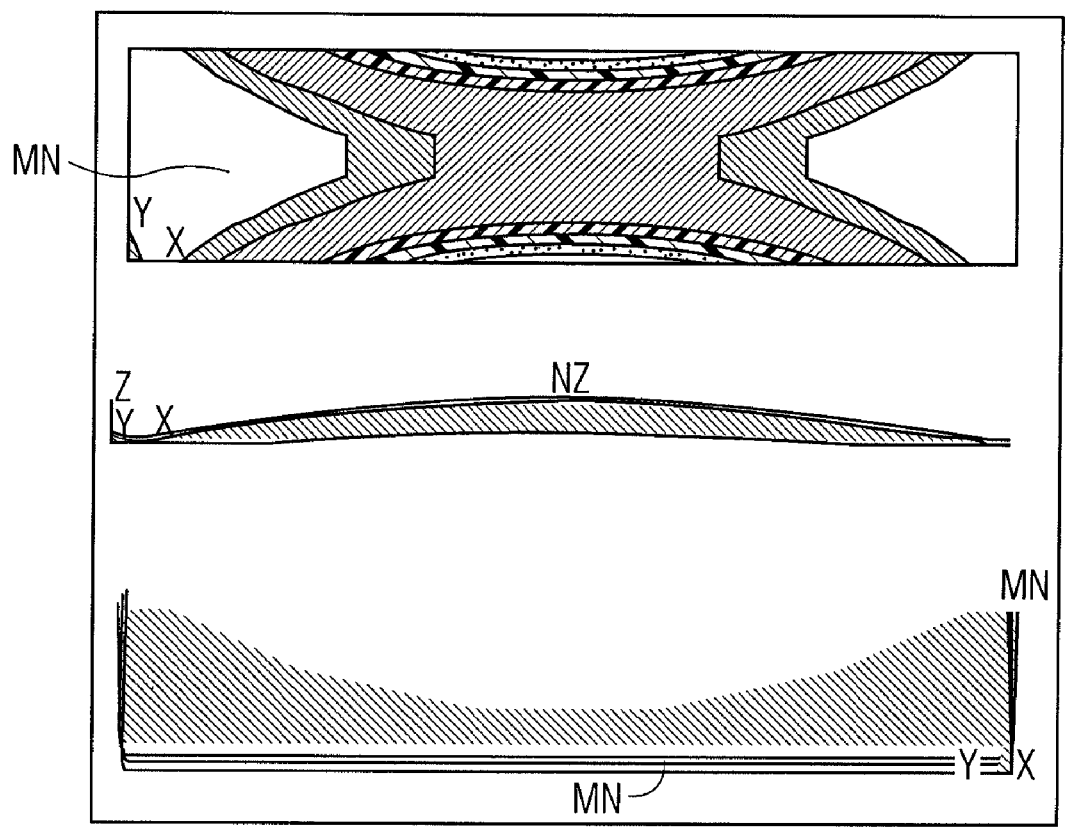

FIG. 2 shows the two switches following the application of a voltage between the upper and lower surfaces. Cantilevering offers the advantage that switching can be achieved by a low voltage (great deflection at low voltage). The switch clamped at both ends, on the other hand, offers higher mechanical stability, but requires a significantly higher voltage to reach the same deflection as the cantilevered switch. However, a closer look at the switch clamped at both ends reveals that the bending shape following the application of the voltage is very unfavorable. As FIG. 3 shows, this switch would only be closed at the edges, leading to a high impedance. Irrespective of its mechanical advantages, the switch clamped at both ends does not represent a useful alternative to the cantilevered switch in this configuration.

It is therefore an object of the invention to supply a device of the type referred to in the first paragraph, which results in a MEMS switch with low switching voltages but good mechanical stability.

This object has been achieved by providing that at least one of the electrode layers is structured into electrodes while defining a displacement area in the piezoelectric element, in which displacement area the first MEMS electrode is located and which displacement area is, under the application of at least one actuating voltage to the electrodes, capable of strong displacement away from and/or towards the substrate in relation to the rest of the piezoelectric element.

In the invention, at least one electrode layer is so structured that only a part of the piezoelectric element is deformable. As a result, not the whole element is brought to the substrate and in particular to the second MEMS electrode when an actuating voltage is applied, but only a specific portion thereof, i.e. the displacement area. In particular, the plurality of electrodes offers the possibility that the piezoelectric element is not deflected as a whole. The ceramic element contracts locally. In particular, this is tailored to give the first MEMS electrode a flat surface.

The piezoelectric layer has preferably been polarized in a polarization mode during manufacture. For this purpose, the electrodes have been so defined that an actuating voltage causing a local contraction of the piezoelectric layer can be applied locally. The use of a polarization mode as such is known to any piezo-ceramics expert. As a rule, higher actuating voltages and a higher temperature are used. The polarization mode here differs from the operating mode by a different distribution of the actuating voltages over the electrodes.

This design is of particular interest for dually or even multiply clamped piezoelectric elements. In this context, opposite sides does not mean the sides usually referred to as upper and lower surface, but rather the "edges" or "separate ends" of the piezoelectric element, between which the deformable piezoelectric element is located, in a fully open position essentially parallel to the substrate. The piezoelectric element is therefore "beam-shaped". Literature also describes it as clamped at both ends.

Such a dually clamped (in English simply "clamped") piezoelectric element in combination with the electrode design has exhibited good deformation characteristics, achieving at low voltages (<5 V) deformations sufficient to bridge switching distances of more than 1 μm. The switching distance of 1 μm is characteristic for MEM switches. It is expedient for the electrodes to be arranged symmetrically around the displacement area.

The switch may be either galvanic or capacitive. In addition, the switch may be used as resonator and as sensor. The piezoelectric layer preferably includes a material with a perovskite structure, such as the materials from the lead-zirconate-titanate group or the like, known to the expert as PbZrTiO$_3$, Pb(X$_a$Nb$_b$)O$_3$—PbTiO$_3$ with a=0.33 or 0.5 and b=1−a and X=In, Mn, Mg, Y, Er, Zn, Ni, Sc or other, with or without La, Mn, Fe, Sb, Sr, Ni, W doping or combinations thereof. Such materials can be applied to the substrate in various ways known to the expert. The piezoelectric element may further include a structural layer, but an asymmetry in rigidity can also be achieved by using different electrode layers. Various ways of producing such MEMS elements are known.

In a first embodiment, the second electrode layer has also been divided into a plurality of electrodes. Each layer preferably includes at least two electrodes with a potential which can be controlled independently. This embodiment can be used in a variety of configurations.

In a first configuration, the dielectric layer is located on the second MEMS electrode, which is the counterelectrode. Both the upper and the lower middle electrode of the piezoelectric element are capable of carrying the signal. In the closed state, the signal is capacitively coupled into the second MEMS electrode. Though the dielectric is thicker if the upper middle electrode carries the signal, this can have a lower internal resistance owing to layer thickness and material selection.

In a second configuration, there is no dielectric layer on the second MEMS electrode. If the lower middle electrode carries the signal, the closed state results in a galvanic contact with the second MEMS electrode, allowing for a DC switch. If the upper middle electrode carries the signal, it is coupled into the lower middle electrode even in the open state via the dielectric. If the switch is closed, the signal is short-circuited by the contact with the second MEMS electrode (counterelectrode).

In a third configuration, the switch is designed to carry the signal via a "transmission line". This transmission line can be discontinuous, so that the first MEMS electrode on the piezoceramic element closes the connection galvanically or capacitively via a dielectric. Alternatively, the transmission line may be continuous. In this case the signal is galvanically or capacitively connected to ground if there is contact with the first MEMS electrode on the piezoceramic element, which may also be covered by a dielectric.

There are two control modes: a polarization mode and an operating mode. In the polarization mode, the portion of the piezoelectric layer opposite the second MEMS electrode is oppositely polarized relative to the adjacent portions.

Figures 9A, 9B, 9C:
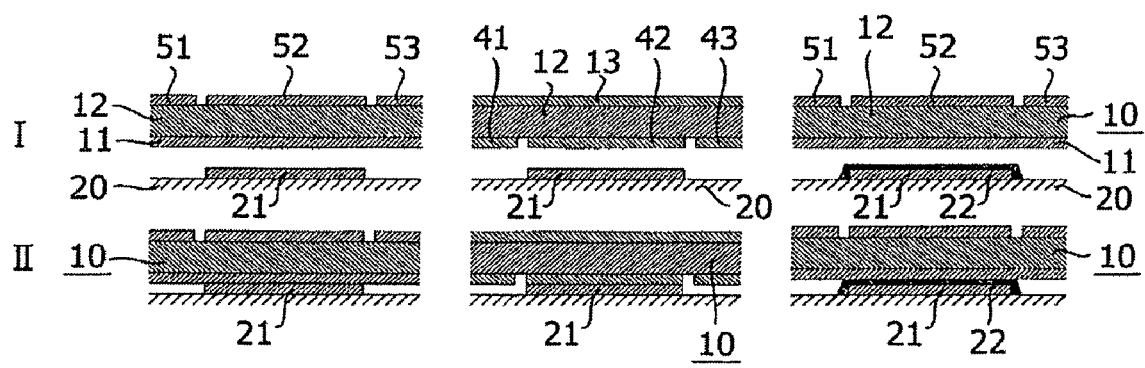
Figure 8A:
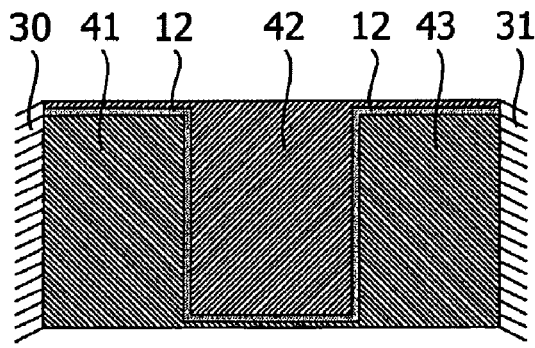
Figure 8B:
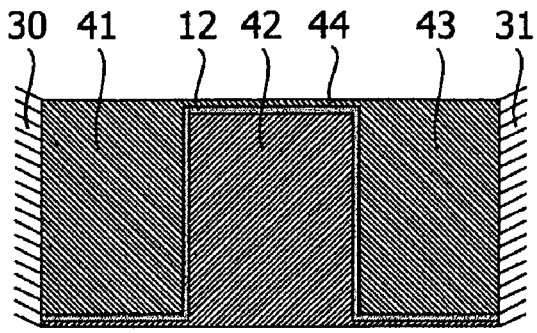
Figure 8C:
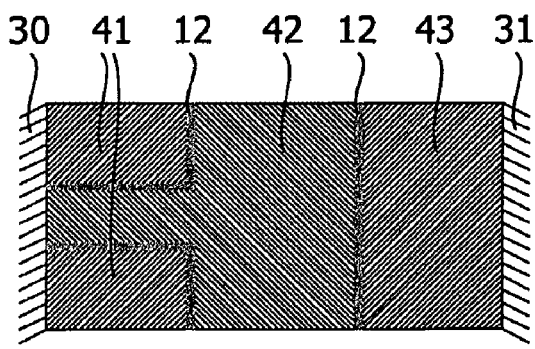
Figure 8D:
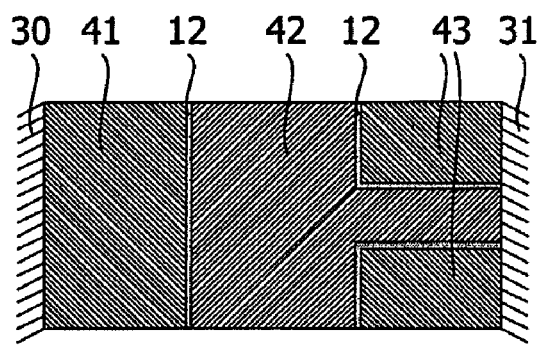
Figure 8E:
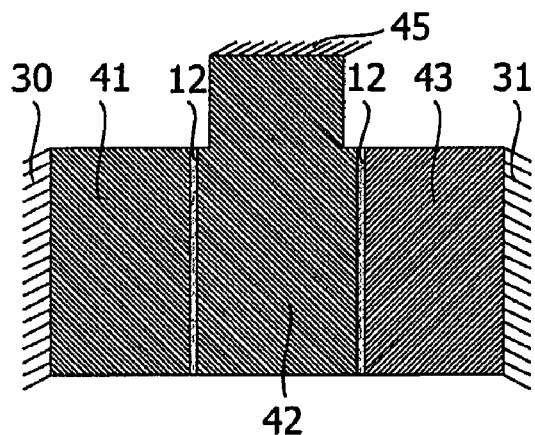
Figure 8F:
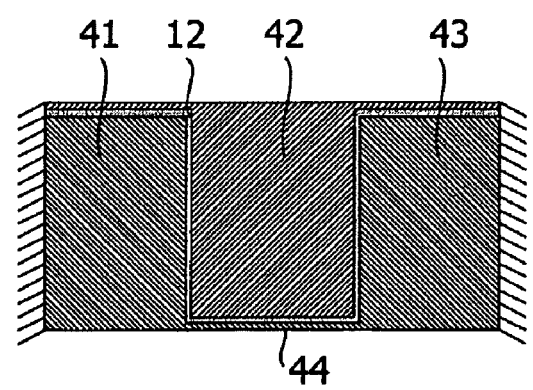

The MEMS switches can be further differentiated with regard to the structuring of the electrodes on the piezoceramic element. In one embodiment, the second electrode layer is a continuous metal layer, while the first electrode layer comprises at least three electrodes, with the middle electrode being located opposite the second MEMS electrode. Here, too, different configurations are available:

In a first configuration, the signal runs along the continuous lower electrode when the switch is open and is galvanically short-circuited when the switch is closed (FIG. 9A). In a second configuration, the signal runs along the continuous upper electrode when the switch is open and is capacitively short-circuited via the piezoceramic element when the switch is closed (FIG. 9B). In a third configuration, the signal runs along the continuous lower electrode when the switch is open and is capacitively short-circuited via the counterelectrode covered by a dielectric when the switch is closed (FIG. 9C).

In this embodiment, too, there are different modes, i.e. a polarization mode and an operating mode.

In a special variant of this embodiment, the electrodes on the structured electrode layer are designed as so-called "interdigital electrodes". The voltage is now applied between the narrow electrodes. The polarization of the piezoceramic element is accordingly oriented largely in the +x or −x direction. The field applied for actuation now extends parallel to the desired expansion or contraction along the x-axis. The d33 piezoelectric coefficient is in this case critical for the achievable deflection. It is twice the value of the d31 piezoelectric coefficient, allowing even greater deflections at low switching voltages, provided that the electrodes have a fine structure and their potential sequence is matched to the bending behavior of the switch.

The invention further relates to a method for the preparation of the MEMS switch. This preparation relates essentially to the application of actuating voltages in the polarization mode. This step represents an expedient way of effecting tailor-made local contraction and deflection in the piezoelectric element.

The invention further relates to the application of MEMS switches. In use, including the operating mode, the actuating voltages are so applied that the displacement area moves as desired. The actuating voltages are generally applied by a driving device (in English driver and in particular driving integrated circuit).

These and other aspects of the invention are apparent from and will be elucidated with reference to the embodiments described hereinafter.

In the drawings:

FIG. 1 is a basic diagram of a cantilevered piezo-MEM and a piezo-MEM clamped at both ends with an electrode each on the upper and lower surfaces, FIG. 2 shows the deflection of the two switches following the application of a voltage to the electrodes, FIG. 3 shows the deflection of the switch clamped at both ends from various angles of view. The bending profile is poor, because the contact surface is very small in the center owing to the strong additional curvature.

Figure 5:
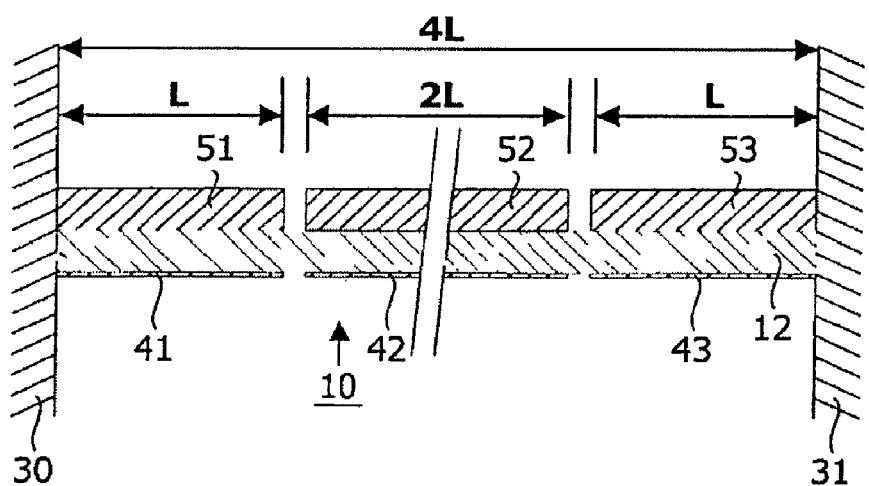
Figure 6:
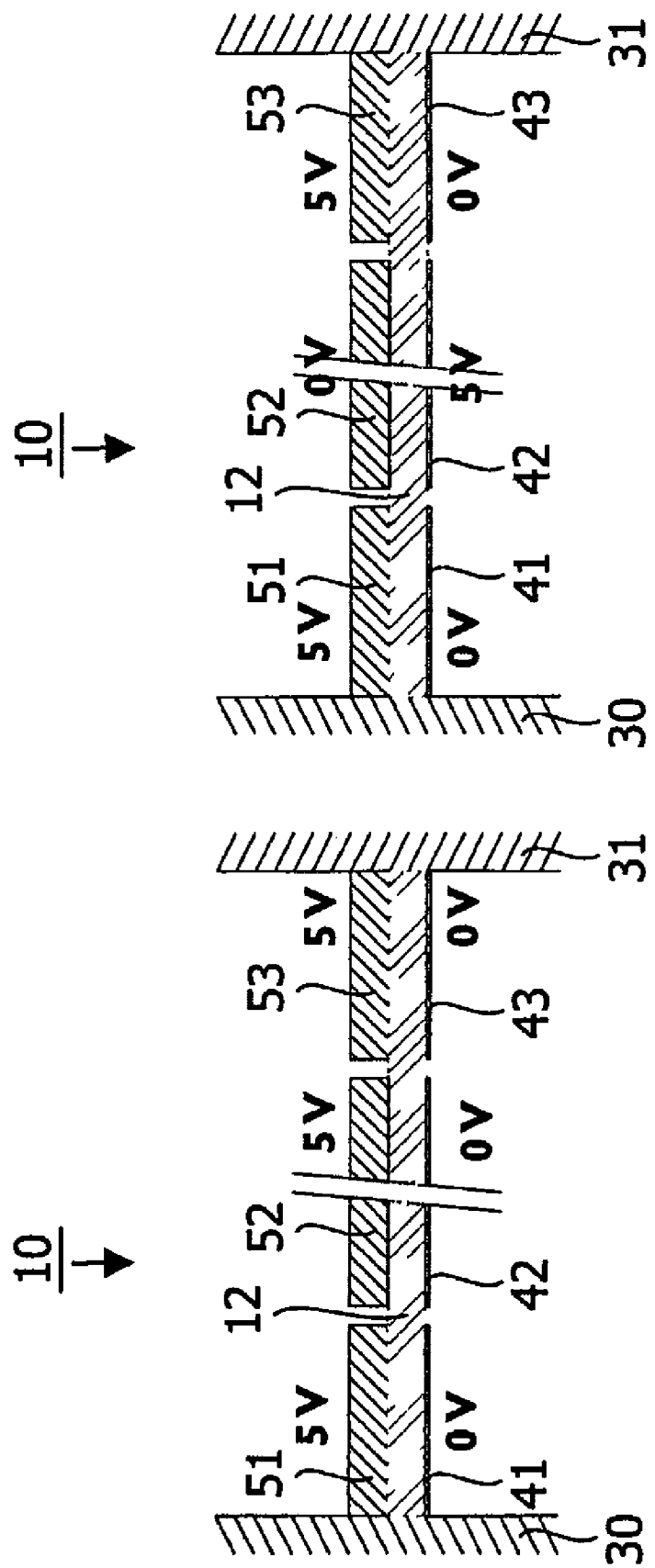
Figure 7:
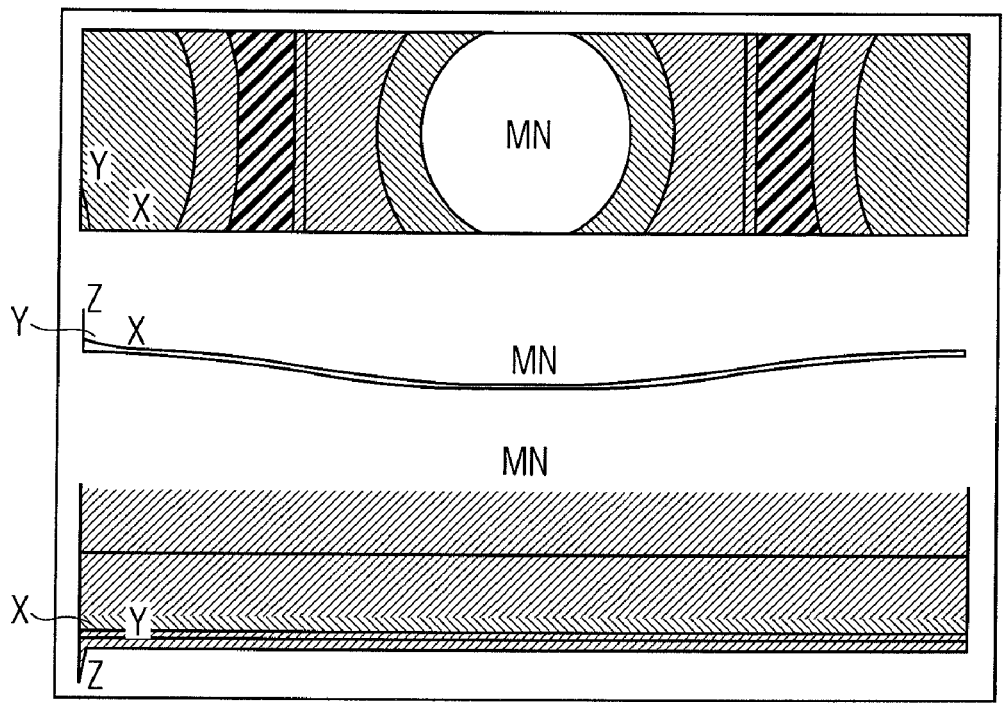
Figure 15:
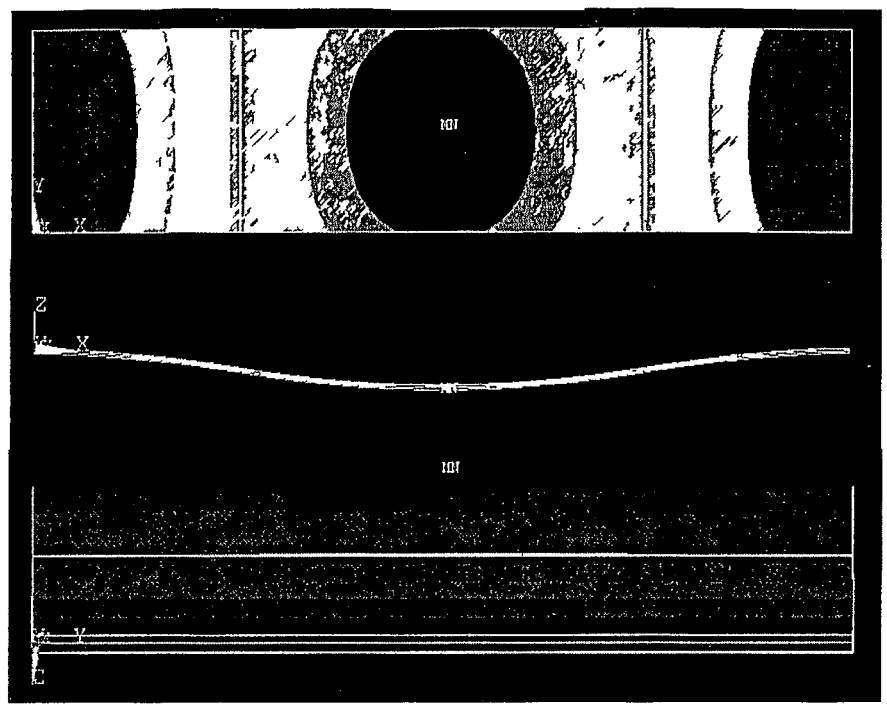
Figure 16:
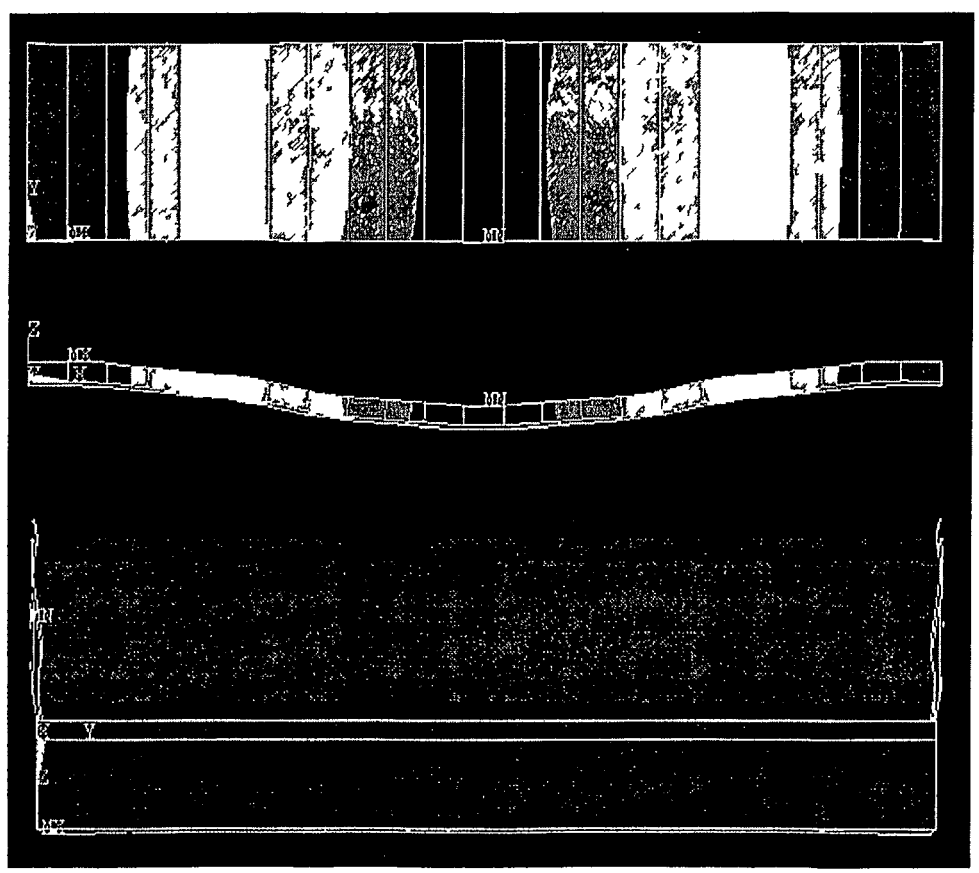

FIG. 4 is a basic diagram of switches or switchable capacitors according to a first embodiment of the invention, FIG. 5 shows a switch clamped at both ends with two electrodes on the upper surface and two electrodes on the lower surface, FIG. 6 shows the switch according to the invention in the polarization (LH) and in the operating (RH) mode. The specified voltages are examples only, and the side electrodes may have a different voltage from the middle electrodes, FIG. 7 shows the bending profile of the switch in the operating mode, FIG. 8 shows various connection configurations of the electrodes, FIG. 9 is a basic diagram of switches or switchable capacitors according to a second embodiment of the invention, FIG. 10 shows a second embodiment of a switch, FIG. 11 shows the activation of the second embodiment of the switch, FIG. 12 shows various connection configurations of the structured electrode, FIG. 13 is a further diagram of the second embodiment of the switch, showing the special variant, FIG. 14 is a basic diagram of the special embodiment of the switch, showing its behavior in the polarization mode (LH) and in the operating mode (RH). A voltage of 5 V is applied to the continuous lower electrode in both cases, FIG. 15 shows a simulated bending profile of the second embodiment, and FIG. 16 shows a simulated bending profile of the special variant of the second embodiment.

Identical reference numbers in different Figures indicate identical features. The Figures are purely diagrammatic. The principal structure of the piezoelectric switch or the switchable capacitor is illustrated in FIG. 4. The MEMS element comprises a piezoelectric element 10 with a first electrode layer 11, a piezoelectric layer 12 and a second electrode layer 13. A first MEMS electrode 42 is located on one surface of the piezoelectric element 10. A second MEMS electrode 21, hereinafter also referred to as counterelectrode, is located on the substrate 20. The first and second MEMS electrodes 42, 21 are arranged to be in mutual, either galvanic or capacitive, contact in a closed state of the MEMS element. The piezoelectric element 10 is clamped to supports on two sides 30, 31. The supports—not illustrated—are located on the substrate 20.

FIG. 4A shows a switch with a dielectric layer 22 on the second MEMS electrode 21. This results in capacitive contact in the closed state. FIG. 4B shows a switch without a dielectric layer on the second MEMS electrode. This results in galvanic or capacitive contact. If the first MEMS electrode 42—also referred to as lower middle electrode—is directly connected to the input, the switch is galvanic. If, however, the signal is carried by the upper middle electrode 52, the result is a capacitive switch even if the first and second MEMS electrodes 42, 21 are connected galvanically.

FIGS. 4A(I) and 4B(I) show the switch in the open state, while FIGS. 4A(II) and 4B(II) show the switch in the closed state. Adjacent to the lower middle electrode 42, further electrodes 41, 43 are arranged in the first electrode layer 11. The second electrode layer 13 likewise contains further electrodes 51, 53. These electrodes 41, 43, 51, 53 are in operation set to a voltage which differs from the voltage of the middle electrodes 42, 52. In this way, the piezoceramic layer 12 can be bent in an expedient way. The mutual connection of the further electrodes 41, 43; 51, 53 in an electrode layer 11, 13 is not impossible. Further Figures illustrate relevant configurations.

In a favorable embodiment of the switch according to the invention, a piezoelectric layer 12 is selected which can be applied in a wet-chemical process using sol-gel technology. A useful material is, for instance, lead-lanthanum-zirconate-titanate ($PbLa_{0.02}Zr_{0.53}Ti_{0.47}O_3$), but various alternatives are known to the expert. Such ferroelectric layers, however, require heat treatment at raised temperatures, generally between 500 and 900° C. For this reason, one electrode layer preferably contains platinum (Pt), which can withstand these temperatures. There are, however, other possibilities, such as conductive oxides. For the other electrode layer, Pt, aluminum or another preferred material can be used. Adhesion layers and barrier layers should be used as far as necessary, as the expert is aware.

A MEMS switch is usually produced with a "sacrificial layer", which is later removed by etching. In this case, the Pt layer is closest to the substrate. Alternatively, the piezoelectric element 10 can be produced separately and then joined to the substrate 20 by soldering or similar methods. In this case, the Pt layer is on the side of the piezoelectric element 10 which is remote from the substrate 20.

FIG. 5 shows the piezoelectric element 10. This is a movable part of the switch on which the invention is based; the second MEMS electrode 21 and the substrate 20 are not shown. The structure of the switch according to the invention is characterized by at least two electrodes, the potentials of which can be controlled independently, mounted on at least one side of the piezoceramic layer 12. In this embodiment, both electrode layers 11, 13 have been divided into three electrodes 41-43, 51-53. In this construction, it is advantageous but not absolutely necessary to design the electrodes in the first electrode layer 11 identical to those in the second electrode layer 13. An insulation made, for instance, of benzo-cyclobutane (BCB) or a similar material with a low dielectric constant can be placed between the upper middle electrode 52 and the side electrodes 51, 53.

If the piezoceramic layer 12 has the length 4L between the clamping points 30, 31, the length of the side electrodes 41, 43 is preferably approximately L and the length of the middle electrode approximately 2L, to achieve a maximum deflection of the piezoceramic layer 12 at low switching voltages. The insulation gap between the electrodes 41, 42, 43 should be reduced to the technological minimum.

The electrode materials are selected to have a modulus of elasticity as different as possible from one another, because, in combination with the layer thickness values of the electrodes, this increases the curvature of the piezoceramic layer. The lower electrode 11 preferably consists of platinum with a modulus of elasticity of 165 GPa, while the upper electrode in the above designs preferably consists of aluminum with a modulus of elasticity of only 71 GPa. In practical terms, this means that a clamped piezoceramic layer of 200×50 µm with a thickness of 0.5 µm achieves a maximum deflection of 0.73 µm at a voltage of 1 V, if the thickness of the platinum lower electrode is 0.1 µm and the layer thickness of the aluminum upper electrode is 0.31 µm. This offers an improvement of approximately 70 percent compared to a platinum upper electrode of optimum layer thickness. As a result, longer switching distances can be bridged by the same voltage or equal distances by a lower voltage. In the first case, the potential force which the switch can apply to the counterelectrode is increased, thus ensuring a better contact, while in the second case, voltage supply requirements are reduced, thus increasing the scope of these microswitches.

FIG. 6 once again shows the piezoelectric element 10, together with the control voltages. Two different modes are illustrated. The first mode, the polarization mode, is used to adjust the piezoceramic layer 12. This is preferably done immediately after the production of the layers of the piezoelectric element 10. Higher voltages and higher temperatures are used in this process. This is still possible in the production stage, because no package or other layers of a more limited thermal stability than the piezoelectric element 10 have yet been applied. The second mode is the operating mode, i.e. the mode which is effective during the use of the unit.

FIG. 6A shows the application of the control voltages in the polarization mode. The piezoceramic layer is polarized in the −z direction, i.e. the electrodes of the first electrode layer 11 are set to a potential differing from that of the electrodes of the second electrode layer 13. In the present case, the potential of the first electrode layer 11 is 0 V, while that of the second electrode layer is 5 V. It should be noted that the value of 5 V is given by way of example only.

FIG. 6B shows the application of the control voltages in the operating mode. Here, the sequence alternates: the lower middle electrode 42 and the side electrodes 51, 53 of the second electrode layer 13 are set to 5 V, while 0 V is applied to the side electrodes 41, 43 of the first electrode layer 11 and to the upper middle electrode 52.

The potential sequences of the polarization and operating modes can be exchanged, so that the piezoceramic layer may be polarized in the +z direction at the sides and in the −z direction below the middle electrodes.

As a result of these electrode configurations combined with a suitable selection of electrode materials and layer thickness values, together with the wiring described above, the piezoceramic layer curves to the right at the two edges and to the left in the center. The bending behavior of the piezoceramic layer therefore corresponds to that imposed by boundary conditions (both ends of the switch fixed in position) and is supported by the selection of electrode materials. This increases the deflection of the switch at equal voltages. Simulations with the Ansys 6.0 software tool based on a clamped piezoceramic layer with the above dimensions of 200 µm×50 µm and a switching voltage of 1 V show that deflection was increased by a factor of approximately five compared to units with continuous upper or lower electrodes but otherwise optimized electrode materials and layer thickness values (FIG. 3). In addition, the bending profile changes to ensure large contact surfaces and thus secure contacting (FIG. 7). The configuration described above can be used as an electrode of a controllable capacitor.

Virtually independent of the electrode materials, the deflection of the clamped piezoceramic layer with a preferred layer thickness of 0.3 µm to 1 µm (thinner if technologically possible) reaches its maximum at an electrode layer thickness ratio between 1:2 and 1:6.

FIG. 8 shows various configurations for activating the divided electrodes. The left-hand part of the illustration shows the underside of the ceramic layer covered by electrodes (hatched), while the right-hand part shows the top. In the topmost configuration, the electrodes extend over the whole width of the piezoceramic layer. The electrodes on the underside are arranged in a mirror image of the top electrodes in order to keep the forces in the material symmetrical. In the middle configuration, the middle electrode is connected on one side only. Here, too, the electrodes are arranged in mirror symmetry. In the bottom arrangement, the top middle electrode is connected to a third base. This configuration offers an opportunity for transmitting the signal to the middle electrode via a wide line with low losses (a further base can be added for symmetry).

FIG. 9 and further Figures show a second embodiment of the switch according to the invention. In this embodiment, only one of the electrode layers 11, 13 has been divided into several electrodes. This embodiment, too, offers the important feature that the electrodes can be activated in different ways in the polarization mode (for adjusting the piezoceramic layer) and in the operating mode (for bending the piezoceramic layer), so that not only different voltages are applied, but the voltages are also distributed differently over the electrodes. In the operating mode, the continuous electrode, i.e. the unstructured electrode layer, carries the signal.

FIG. 9 shows the basic structure of a piezoelectric switch or controllable capacitor in a second embodiment of the invention. This embodiment includes a variety of configurations characterized by the fact that the continuous electrode carries the signal:

FIG. 9A shows a switch with a single, continuous lower electrode 11. When the switch is open, the signal runs along this lower electrode 11. When the switch is closed, the signal is galvanically short-circuited or coupled in. This lower electrode 11 is therefore the first MEMS electrode.

FIG. 9B shows a switch with a single, continuous upper electrode 13. When the switch is open, the signal runs along the continuous upper electrode. When the switch is closed, the signal is capacitively short-circuited via the piezoceramic layer or coupled in.

FIG. 9C shows another switch with a single, continuous lower electrode 11. In this case, there is a dielectric 22 on the second MEMS electrode 21 on the substrate 20. When the switch is open, the signal runs along the continuous lower electrode; when the switch is closed, it is capacitively short-circuited via the second MEMS electrode 21 or coupled in.

The term short-circuited implies that the signal is passed to ground. If the signal is coupled in, the second MEMS electrode is connected to a signal line.

FIG. 10 shows the piezoelectric element 10 of this embodiment. The structure of the switch according to the invention is characterized by at least two electrodes, the potentials of which can be controlled independently, mounted on one side of the piezoceramic layer 12. The electrode on the other side of the piezoceramic layer is continuous.

If the piezoceramic layer has the length 4L, the length of the side electrodes is approximately L and the length of the middle electrode approximately 2L, to achieve a maximum deflection of the piezoceramic layer at low switching voltages. The insulation gap between the electrodes should be reduced to the technological minimum.

The electrode materials are selected for maximum deflection on the one hand and for a high conductivity of the material used for through-metallizing on the other hand. Platinum is the preferred material for a thin, structured electrode and a thicker aluminum layer for an unstructured electrode. Materials with high conductivity, such as copper, silver or gold, are also suitable for unstructured electrodes.

Virtually independent of the electrode materials, the deflection of the clamped piezoceramic layer with a preferred layer thickness of 0.3 µm to 1 µm (thinner if technologically possible) reaches its maximum at an electrode layer thickness ratio between 1:2 and 1:10.

Diagrams A and B of FIG. 11 show the applied voltages in the two modes. In the polarization mode (FIG. 11A), the piezoceramic layer is polarized in the +z (or opposite) direction in the area of the side electrodes, while it is polarized in the −z (or opposite) direction in the area of the middle electrode, i.e. the potential of the structured electrodes, for instance on the underside of the piezoceramic layer, alternates. In production, at least three different potentials are therefore required, while the operating mode requires only two different potentials (FIG. 12 RH side).

The potential sequences of the polarization and operating modes can be exchanged in principle, which would, however, place higher demands on the control electronics of the application. The specified voltages of 5 V and 0 V are given by way of example. Other voltages may be used. The voltages in the polarization mode, in particular, can be higher than those in the operating mode. In addition, the voltage applied to the electrodes where the ceramic layer contracts may be lower than the voltage applied to the electrodes where the ceramic layer expands. In the illustrated example, the middle electrode 42 is polarized in the opposite direction by applying a negative potential in the polarization mode. The control voltage applied to the lower middle electrode 42, for instance, may be 3 V or even 1 V instead of 5 V. This is to prevent the opposite polarization of the piezoceramic layer by the control voltage.

FIG. 12 shows various configurations for activating the structured electrode. The middle electrode 42 can be contacted using very narrow connections 42A, because it does not carry a signal. Its influence on the deflection of the piezoceramic layer 12 is therefore minimized. In the arrangement of FIG. 12A, the middle electrode 42 is connected to a third base 45.

Figure 13A:
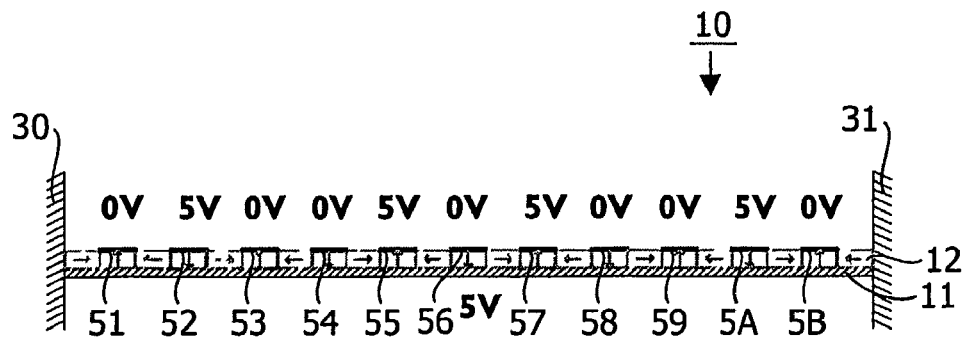
Figure 13B:
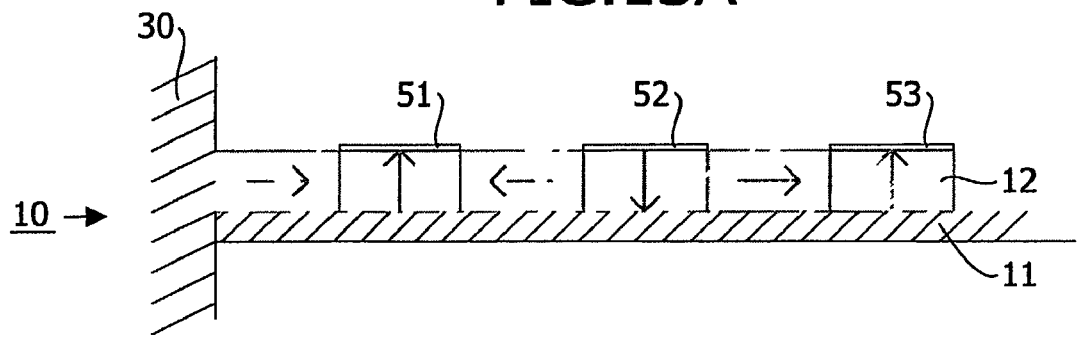

A further variant of this embodiment of a clamped switch, which allows one side of the piezoceramic layer to be completely metallized, is shown in FIG. 13. FIG. 13B shows a detail from FIG. 13A to explain the polarization in the piezoceramic layer. In contrast to the configuration described above, which uses the d31 piezoelectric coefficient to deflect the switch, die d33 coefficient is used in this case. This offers the advantage that the deformation of the piezoceramic layer 12 along the polarization axis is approximately three times the deformation at right angles to the polarization axis at the same voltage. This is particularly expedient if the structured electrode 13 has a very fine structure. In the present example, this is the upper electrode 13, but it may alternatively be the lower electrode layer 11. In this particular case, a platinum layer has been chosen for the upper electrode and an aluminum layer for the lower electrode. This is suitable for processes wherein the piezoelectric element is only assembled after the manufacture of the substrate.

The potential sequence is so chosen that the piezoceramic layer expands along the polarization axis. As the field strength on the top of the piezoceramic layer between the electrodes with different potentials is at its maximum, this expands most strongly, bending the piezoceramic layer downwards in the side area. This effect is reinforced by the fact that the piezoceramic layer vertically expands above the upper electrodes, thus contracting laterally. As a result of the greater rigidity of the thin upper Pt electrode compared to the thicker lower aluminum electrode, this area, too, is bent downwards. By changing the potential sequence, the bending behavior in the middle of the piezoceramic layer can be changed.

The deflection of the switch can be optimized in this configuration by matching the bending behavior of the piezoceramic layer to the dual clamping arrangement. This is achieved by changing the potential sequence between $1/10$ and $4/10$, preferably at $1/4$, of the overall length of the piezoceramic layer and between $6/10$ and $9/10$, preferably at $3/4$, of the overall length of the piezoceramic layer. In accordance with this, different potential sequences are required for the polarization mode and the operating mode as shown in FIG. 9. The two modes may also be interchanged. In addition, different voltages can be selected in the operating mode in dependence on the polarization of the piezoceramic layer, so that the voltage at the sides of the piezoceramic layer varies between e.g. 5 V and 0 V and in the middle between 1 V and 0 V (or vice versa) to avoid depolarization effects.

The potential of the continuous contact electrode should, in order to obtain maximum deflection at low voltages, be so chosen that the deformation of the piezoceramic layer below the structured electrode in combination with the rigidity and layer thickness values of the electrodes supports the deflection of the piezoceramic layer.

If the switch is open without the application of a voltage, i.e. the piezoceramic layer is not deflected, polarization and voltage sequence have to be so matched that the complete metallized surface of the piezoceramic layer is curved outwards when the operating voltage is applied. As an alternative, the piezoceramic layer can be mechanically preloaded to close the switch without any operating voltage. In this case, polarization and voltage sequence have to be so matched that the complete metallized surface of the piezoceramic layer is curved inwards when the operating voltage is applied.

Figures 14A, 14B:
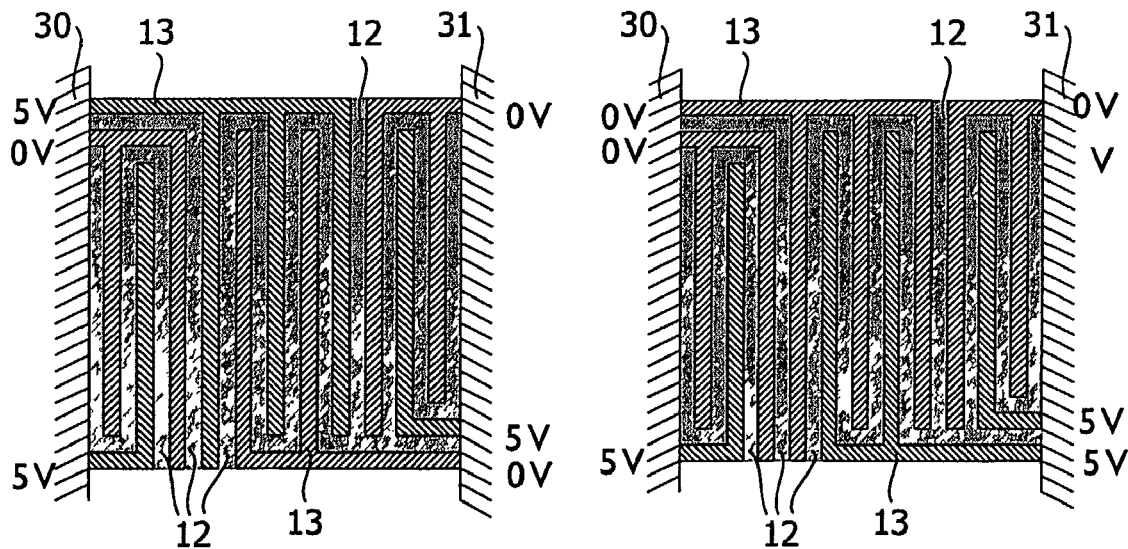

FIG. 14 is a top view of an example of the electrode configuration of the second electrode layer 13, the piezoelectric layer 12 being visible between the structured electrodes. The control acting on the electrodes is indicated. FIG. 14A illustrates the activation in the polarization mode, FIG. 14B the activation in the operating mode. As in the Figures described above, these activation processes are different, not so much in their voltage values as in the distribution over the electrodes. In FIG. 14A, the distribution (similar to FIG. 13) is 0V-5V-0V-5V-0V-5V-0V-5V-0V-5V-0V. In the polarization mode, therefore, the piezoceramic layer, in particular, is polarized in the direction of the surface of the piezoelectric element (in the direction of the d33 coefficient). In FIG. 14B, as in FIG. 13, the distribution is 0V-5V-0V-0V-5V-0V-5V-0V-0V-5V-0V. This is not just an alternating pattern, but a pattern divided into three parts. The transition generates forces against the direction of polarization. This happens at the edge in the present case. As a result, the piezoceramic layer contracts locally, expanding in other positions. This alternation of contraction and expansion causes the piezoelectric element 10 to move towards or away from the second MEMS electrode on the substrate.

As a result of these electrode configurations of the second embodiment combined with a suitable selection of electrode materials and layer thickness values, together with the wiring described above, the bending behavior of the piezoceramic layer is different at the edges and in the middle. This satisfies the boundary conditions (both ends of the switch fixed in position). This behavior is further supported by the electrode materials selected. This increases the deflection of the switch at one and the same voltage. The resulting bending profiles of both configurations are shown in FIGS. 15 and 16.

The configuration described above can also be used as an electrode of a controllable capacitor.

To summarize:

The invention relates to a novel piezo-electromechanical switch (P-MEMS) clamped at both ends which, notwithstanding its extremely small overall size, is capable of bridging switching distances of several µm owing to its special electrode design in combination with matched electronic activation, electrode material and layer thickness. At the same time, the very flat contact surface improves the contact. Compared to cantilevered switches, mechanical stability is significantly enhanced.

The piezo-electromechanical switch (P-MEMS) offers the advantage of reducing switching voltage to less than 5 V. This makes components of this type suitable for mobile applications. In addition to this aspect, the minimizing of losses is of utmost importance. The invention described here fulfils all of these requirements.

This is achieved by local activation of the piezoceramic layer, generating opposing forces therein under the application of actuating voltages. This results in a transition between expansion and contraction in the piezoceramic layer and thus in different curvatures. In an element clamped at both ends, this means curvature to the left and to the right. In a multiply clamped element, two curvatures to the left and one curvature to the right, along the x-axis and the y-axis respectively (both in the surface of the piezoceramic layer), are preferred. The opposing forces are the result of the prior polarization of the piezoceramic layer in a polarization mode. An actuating voltage applied against the (local) polarization direction results in contraction, while an actuating force in the polarization direction results in expansion.

In the first embodiment, there are structured electrodes on both sides of the piezoceramic layer, enabling portions thereof to be activated in different ways.

In the second embodiment, the complete metallization of one side of the piezoceramic layer dramatically reduces the resistance of this signal-carrying metal layer of the dually clamped switch. At the same time, the special electrode design enables the switch, irrespective of its extremely small overall size (e.g. 200 µm×50 µm), to bridge switching distances of several micrometers at a switching voltage of lass than 5 V and ensures, owing to the fact that the bending behavior of the piezoceramic layer is matched to the (dual) clamping arrangement, a large-area and thus low-loss contact with the counterelectrode.

In a particularly useful variant of the second embodiment, the upper electrode 13 has a very fine structure, defining a great number of parallel lines which can be set to different potentials. This permits the local activation of the piezoceramic layer and the use of either the d31 piezoelectric coefficient at right angles to the piezoelectric element or the d33 piezoelectric coefficient in the plane of the piezoelectric element. This results in a much greater expansion.

In a further variant, the second MEMS electrode 21 on the substrate 20 is designed as a transmission line. The required base surface is located in the substrate 20. The first MEMS electrode can be designed as a relay (i.e. a bridge between two sections of the transmission line). The transmission line may, however, alternatively be continuous, the MEMS element with a dielectric on the second MEMS electrode being a capacitor.

In both embodiments, the electrode layers 11, 13 are further so designed that the voltage distribution in the polarization mode differs from that in the operating mode. In the polarization mode, the piezoceramic layer 12 can be adjusted for optimum deflection. In the operating mode, this deflection is then obtained using rather low control voltages. In the second embodiment, the application of three different potentials in the polarization mode is expedient. Two potentials are sufficient in the operating mode.

A further advantage lies in the fact that the piezoelectric layer 12 can be used as a coupling surface. High-frequency signals, in particular, can be carried in an electrode layer 11, 13 with a low internal resistance. By means of a coupling arrangement via the piezoelectric layer, the signal can then be transmitted further. Owing to the high dielectric coefficient of the piezoceramic layer—an $\in_r$ value above 1000 is perfectly feasible—the high-frequency signal is not significantly interfered with. In this context, it is particularly useful that the second electrode layer is completely or at least largely made of aluminum and preferably has a thickness of more than 0.5 µm, in particular approximately 1 µm or more.

The invention claimed is:

1. An electronic device with a micro-electromechanical switch, comprising:
   a piezoelectric element with a piezoelectric layer located between a first and a second electrode layer with at least one electrode being located in each of said electrode layers,
   a first and a second MEMS electrode said first MEMS electrode being located on a surface of the piezoelectric element and said second MEMS electrode being located on the surface of a substrate so that the first MEMS electrode moves away from and/or towards the second MEMS electrode under the application of an actuating voltage to the piezoelectric element, and
   wherein at least one of the electrode layers is structured into electrodes while defining a displacement area in the piezoelectric element in which displacement area the first MEMS electrode is located and which displacement area is, under the application of different actuating voltages to different ones of the electrodes, configured to displace away from and/or towards the substrate in relation to the rest of the piezoelectric element.

2. A device as claimed in claim 1, characterized in that the piezoelectric layer is polarized, and in that the electrodes are configured to apply an actuating voltage causing a local contraction of the piezoelectric layer.

3. A device as claimed in claim 1, characterized in that the piezoelectric layer curves to the left on one side of the displacement area and to the right on an opposite side.

4. A device as claimed in claim 1, characterized in that the piezoelectric element is clamped to mechanical supports on a first and an opposite second side.

5. A device as claimed in claim 4, characterized in that the electrodes are defined symmetrically around the displacement area.

6. A device as claimed in claim 1, characterized in that each of the first and the second electrode layers contains at least two electrodes.

7. An electronic device as claimed in claim 1, characterized in that the second electrode layer is a continuous metal layer while the first electrode layer contains at least three electrodes of which the middle electrode is essentially located opposite the second MEMS electrode.

8. An electronic device as claimed in claim 7, characterized in that the first electrode layer is located on the surface facing the second MEMS electrode.

9. An electronic device as claimed in claim 1, wherein the piezoelectric element is configured for polarization in response to the application of actuating voltages to the electrodes, wherein the piezoelectric layer is so polarized that the piezoelectric layer locally expands and contracts when suitable actuating voltages are applied in the operating mode.

10. An electronic device as claimed in claim 1, further including a driver configured to apply the actuating voltages to the electrodes to cause the piezoelectric layer to locally expand and contract.

11. An electronic device as claimed in claim 10, wherein the driver is configured to apply an actuating voltage, to effect a local contraction of the piezoelectric layer, that is lower than an actuating voltage applied in the direction of the polarization which has already been introduced.

12. A micro-electromechanical switch comprising:
    a substrate;
    a MEMS electrode on a surface of the substrate;
    over the MEMS electrode, a piezoelectric component having
      a piezoelectric layer,
      first and a second electrode layers on opposite sides of the piezoelectric layer, at least one of the electrode layers defining a displacement area of the piezoelectric component,
      at least one electrode in one of the electrode layers,
      at least two electrodes in another one of the electrode layers, and
      a MEMS electrode located in the displacement area; and
    a driver circuit configured to drive the electrodes in a polarization mode to apply a distribution of different operating voltages over the electrodes in the electrode layers and to polarize the piezoelectric layer, and drive the electrodes in an operating mode to displace the displacement area in a direction that is away from or towards the substrate, while maintaining other regions of the piezoelectric component stationary.

13. A method of operating an electronic device with a micro-electromechanical switch, the method comprising:
    in a piezoelectric element having a piezoelectric layer located between a first and a second electrode layer with at least one electrode being located in each of said electrode layers, applying a voltage to the electrode layers to polarize the piezoelectric element, and
    applying an actuating voltage to a first and a second MEMS electrode, the second MEMS electrode being located on the surface of a substrate, to cause the first MEMS electrode to move away from and/or towards the substrate in relation to the rest of the piezoelectric element,
    wherein said first MEMS electrode is located in a displacement area of said piezoelectric element defined by one of said electrode layers on a surface of the piezoelectric element.

* * * * *